(12) United States Patent
Lyons et al.

(10) Patent No.: US 7,015,504 B2
(45) Date of Patent: Mar. 21, 2006

(54) SIDEWALL FORMATION FOR HIGH DENSITY POLYMER MEMORY ELEMENT ARRAY

(75) Inventors: Christopher F. Lyons, Fremont, CA (US); Mark S. Chang, Los Altos, CA (US); Sergey D. Lopatin, Santa Clara, CA (US); Ramkumar Subramanian, Sunnyvale, CA (US); Patrick K. Cheung, Sunnyvale, CA (US); Minh V. Ngo, Fremont, CA (US); Jane V. Oglesby, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/699,903

(22) Filed: Nov. 3, 2003

(65) Prior Publication Data

US 2005/0092983 A1    May 5, 2005

(51) Int. Cl.
*H01L 47/00* (2006.01)
*H01L 29/06* (2006.01)
*H01L 35/24* (2006.01)
*H01L 51/00* (2006.01)

(52) U.S. Cl. ................................. 257/40; 257/4; 257/5

(58) Field of Classification Search ................ 257/4, 257/40, 5, 209
See application file for complete search history.

(56) References Cited

U.S. PATENT DOCUMENTS

| | | | |
|---|---|---|---|
| 6,501,134 B1 | 12/2002 | Krivokapic | |
| 6,528,518 B1 | 3/2003 | Brown et al. | |
| 6,545,891 B1 | 4/2003 | Tringali et al. | |
| 6,656,763 B1 * | 12/2003 | Oglesby et al. | 438/99 |
| 6,803,267 B1 * | 10/2004 | Subramanian et al. | 438/197 |
| 6,858,883 B1 * | 2/2005 | Fricke et al. | 257/104 |
| 6,943,370 B1 * | 9/2005 | VanBuskirk et al. | 257/40 |
| 2003/0173612 A1 | 9/2003 | Krieger et al. | |

FOREIGN PATENT DOCUMENTS

WO    WO 03/032392 A2    4/2003

OTHER PUBLICATIONS

International Search Report dated Aug. 10, 2005, mailed Aug. 22, 2005, for PCT Application Ser. No. PCT/US2005/031275, 4 Pages.

* cited by examiner

*Primary Examiner*—Nathan J. Flynn
*Assistant Examiner*—Victor A. Mandala, Jr.
(74) *Attorney, Agent, or Firm*—Amin & Turocy, LLP

(57) ABSTRACT

Systems and methodologies are disclosed for increasing the number of memory cells associated with a lithographic feature. The systems comprise memory elements that are formed on the sidewalls of the lithographic feature by employing various depositing and etching processes. The side wall memory cells can have a bit line of the wafer as the first electrode and operate with a second formed electrode to activate a portion of an organic matter that is formed there between.

22 Claims, 18 Drawing Sheets

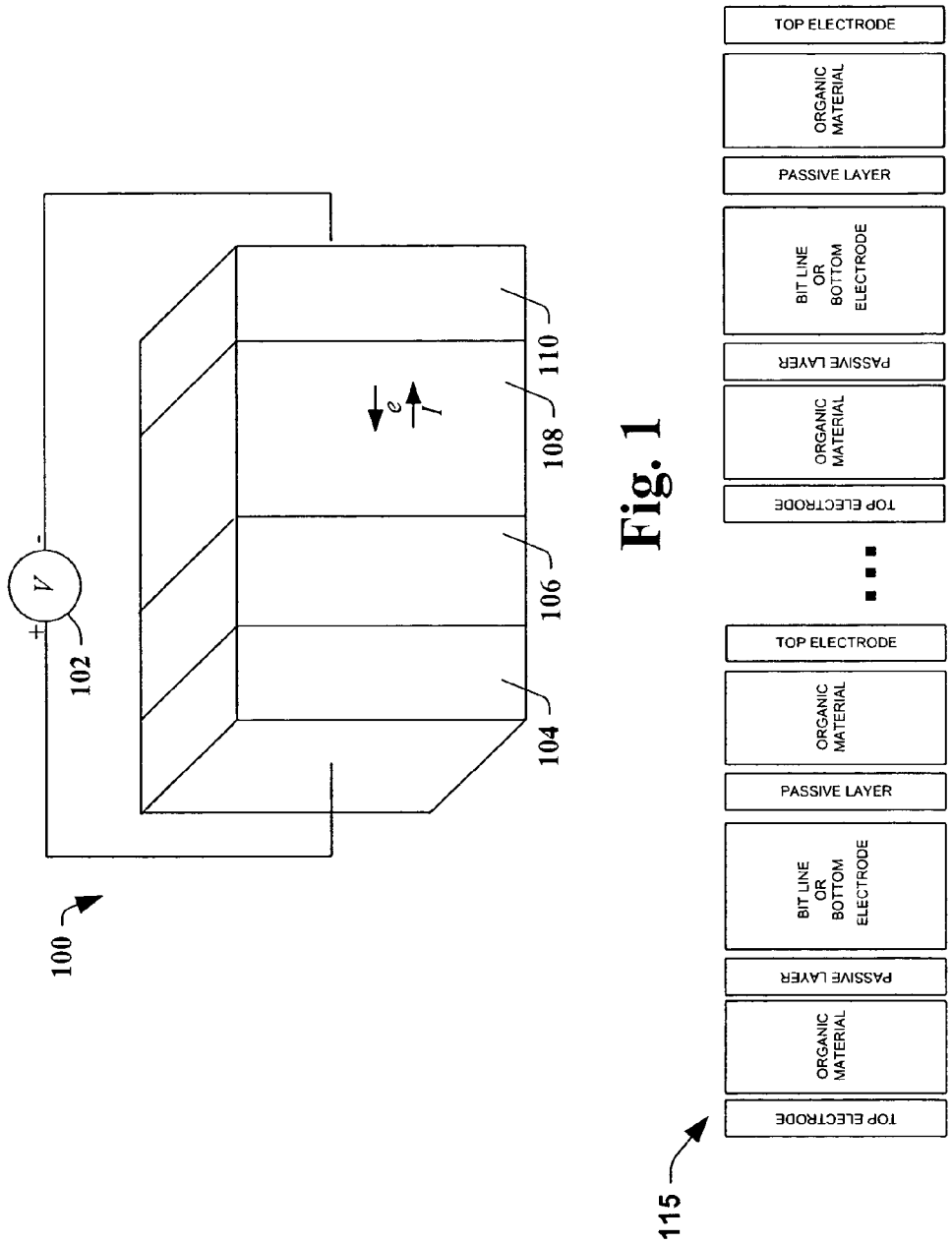

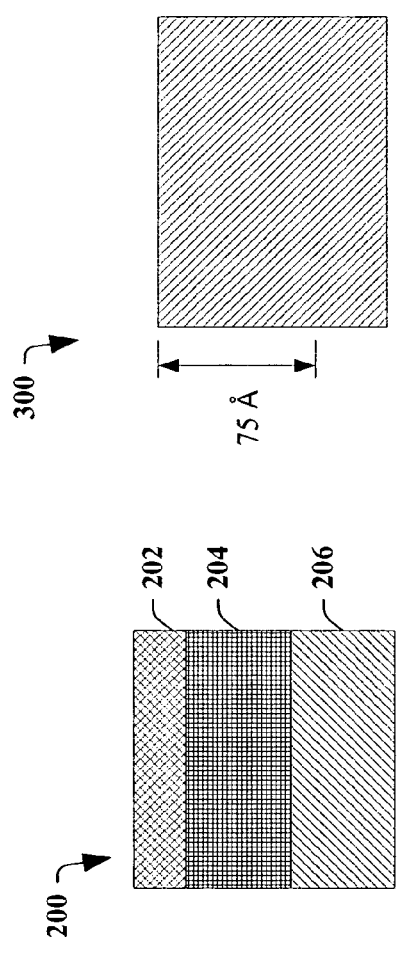
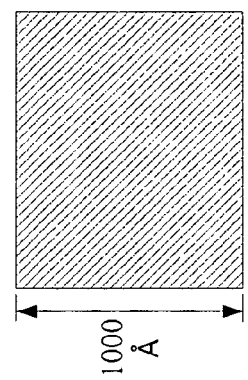
Fig. 3
Fig. 5
Fig. 2
Fig. 4

SIDEWALL FORMATION FOR HIGH DENSITY POLYMER MEMORY ELEMENT ARRAY

FIELD OF THE INVENTION

The present invention relates generally to semiconductor structure fabrication and, in particular to a system and methodology for forming memory elements in a semiconductor chip.

BACKGROUND OF THE INVENTION

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Non-volatile memory cells include, but are not limited to, ROM, programmable read only memory (PROM), erasable programmable read only memory (EPROM), electrically erasable programmable read only memory (EEPROM), flash EEPROM the like. Volatile memory cells generally provide faster operation at a lower cost as compared to non-volatile memory cells.

Memory cells often include arrays of memory cells. Each memory cell can be accessed or "read", "written", and "erased" with information. The memory cells maintain information in an "off" or an "on" state, also referred to as "0" and "1". Typically, a memory cell is addressed to retrieve a specified number of byte(s) (e.g., 8 memory cells per byte). For volatile memory cells, the memory cells must be periodically "refreshed" in order to maintain their state. Such memory cells are usually fabricated from semiconductor devices that perform these various functions and are capable of switching and maintaining the two states.

At the same time, the increased demand for information storage is commensurate with memory cells having an ever increasing storage capacity (e.g., increase storage per die or chip) and the progress of integrated circuit technology has been marked by a continuing reduction in the size of memory cells. Smaller devices yield the dual advantages of greater packing density and increased speed. Nonetheless, defining smaller as well as denser features, is limited to the lithographic resolution processes employed in creating these features.

Features have been conventionally defined by an inlay process wherein, the substrate surface, including memory cells and other devices formed on the wafer, is first covered with a dielectric layer such as oxide. A patterned photoresist profile is then formed on the dielectric surface. The resist profile has openings, or holes, in the photoresist corresponding to the areas where vias are to be formed in the dielectric. Other areas of the resist are formed into elongated openings to create interconnect lines. The photoresist-covered dielectric layer is then etched to remove oxide underlying the openings in the photoresist. The photoresist is then stripped away. Copper or another suitable metal is then used to fill the vias and interconnects, the metal typically being deposited by chemical vapor deposition (CVD). The result is a dielectric layer with conductive metal at various levels therein. The surface of the dielectric layer is typically smoothed using a CMP process. Additional dielectric layers are then added to complete the required interconnections for the chip. Such dielectric layers with interconnects and vias formed by the inlay processes are sometimes referred to as interlevel dielectrics or, alternatively, as inter level dielectric layers.

Initially, visible light was used, but the desire for smaller feature size has led to the use of UV light and x-rays. Accordingly, by employing high-resolution photolithography, ultra-thin lines and vias are created in the dielectric. Patterns of openings are formed in the overlying photosensitive resist by directing the desired patterns of light onto the photoresist, the light being of a wavelength to which the photoresist is sensitive. Subsequently, the photoresist is "developed" to remove the light-exposed areas, leaving behind a photoresist mask on the surface of the dielectric. The photoresist mask is then used as a pattern in subsequent etching of the underlying dielectric. As such, the lithographic resolution affects, and the minimum feature size as well as the creation of the various features of the memory cells, is thus limited by the lithographic resolution. Accordingly, there exists a need for increasing the memory storage of semiconductor chips while employing the lithographic techniques for semiconductor fabrication.

SUMMARY OF THE INVENTION

The following presents a simplified summary of the invention in order to provide a basic understanding of one or more aspects of the invention. This summary is not an extensive overview of the invention. It is not intended to identify key, as well as critical, elements of the invention, or to delineate its scope. Rather, the sole purpose of this summary is to present some concepts of the invention in a simplified form as a prelude to the more detailed description that is presented hereinafter.

The subject invention provides for a system and methodology for increasing the number of organic memory cells associated with a lithographic feature. According to one or more aspects of the invention, polymer memory elements are formed on the sidewalls of each lithographic feature during the semiconductor making process. Initially a bit line composed of conductive material, (e.g., copper), having an associated barrier is formed according to an inlay process over a wafer surface, such that the bit line pattern protrudes out of, and is raised above the silicon surface. This bit line protrusion, in effect, forms the lower electrode, (i.e. bit line electrode), of a memory cell according to the present invention.

Subsequently and during the diffusion and implant stage, a selective conductive layer that comprises a passive layer or media, (e.g. a $Cu_2S$ composition), and an organic layer or media, (e.g. a polymer formation), is formed over the bit line. This selective conductive layer is deposited in a manner as to form a ridge shape or a dune, over the silicon substrate and the bit line.

Next an etching process is employed and the horizontal surfaces for both the selective conductive layer, as well as the conductive bit line are etched away. An even surface is thus created for both the passive layer (e.g. $Cu_2S$) and the bit line protrusion. After this etching process, the remaining structure comprises two strips of the selective conductive layer, one on either side of the bit line protrusion. Put differently, the bit line protrusion is now sandwiched between two strips of the selective conductive material, and thus forms a cell like structure. This cell structure allows for each bit line protrusion to contact or associate with two adjacent strips, which are comprised of the selective conductive material, at the same time.

Next, upon the cell structure, a top electrode layer is deposited as to form a ridge or dune shape thereupon. This provides for a plurality of edges to be shared between the top electrode layer and the cell structure. In effect, the selective conductive layer is now being sandwiched between the bit line protrusion from one side, and the top electrode layer from the other side.

Next, by employing an etching process, the horizontal surface for the top electrode layer is being etched away, as to form two electrode strips, each being stacked on one side of the cell structure, and thus, forming a memory cell according to the present invention. In effect, the structure of the resulting memory cell allows for the bit line protrusion, (the lower electrode of the memory cell), to associate with two sets of memory elements, (each set comprising a selective conductive material and a top electrode layer.) Put differently, two bits of memory cells, which can be selectively activated, are now available for, and associate with the lithographic features created according to the present invention.

In another aspect according to the present invention, the etching process is employed at a different stage and only after both the selective conductive layer and the top electrode layer have been deposited. Also, the etching process is not limited to a horizontal etching process and may be employed at various angles, selectively etching the different layer portions as to create the memory elements on the walls of the lithographic feature.

Furthermore, according to another aspect of the present invention, the passive layer is deposited on to the conductive layer via a plasma enhanced chemical vapor deposition (PECVD) employing a metal organic precursor. The precursor facilitates depositing the conductivity facilitating compound in the absence of the toxic hydrogen sulphide and at a relatively low temperature and pressure (e.g. between about 473 to 573 K and 0.2 Pa., respectively.)

The deposition processes can be monitored and controlled to facilitate, among other things, depositing the layers to a desired thickness at various locations. Moreover, other aspects of the invention provide for other conductive facilitating compounds to be employed, instead or in addition to the $Cu_2S$.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

BRIEF DESCRIPTION OF THE DRAWINGS

FIG. 1 is a perspective of an organic memory device in accordance with an aspect of the present invention.

FIG. 1(a) illustrates a plurality of laterally stacked memory cells, according to one aspect of the present invention.

FIG. 2 is a block diagram of a passive layer that can be employed in an organic memory device in accordance with an aspect of the present invention.

FIG. 3 is a block diagram illustrating an organic polymer layer formed by a CVD process in accordance with an aspect of the present invention.

FIG. 4 is a block diagram illustrating another organic polymer layer formed by a CVD process in accordance with an aspect of the present invention.

FIG. 5 is a block diagram of yet another organic polymer layer formed by a CVD process in accordance with an aspect of the present invention.

DETAILED DESCRIPTION OF THE INVENTION

Figure 6:
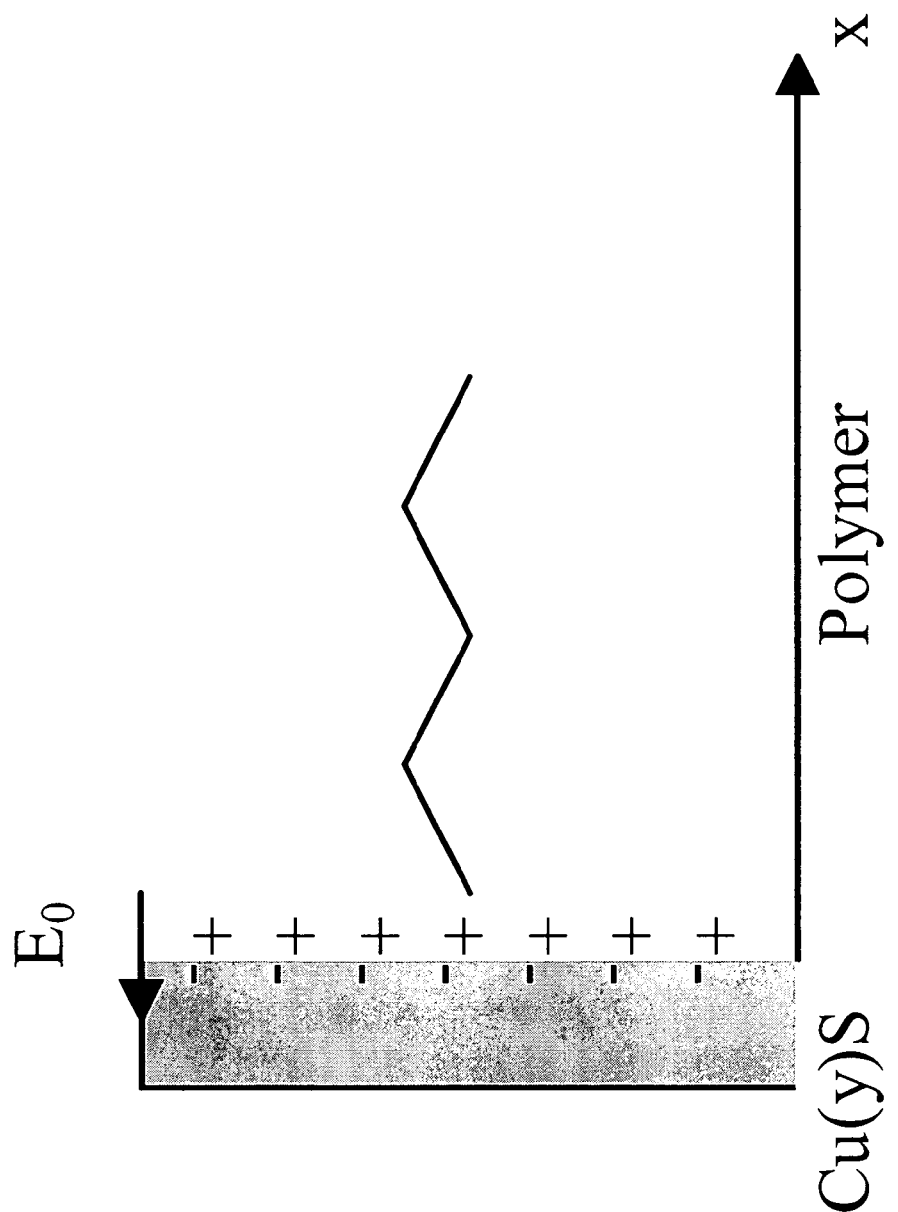
FIG. 6 is a graph depicting the effect of an intrinsic electric field on an interface between a passive layer and an organic polymer layer in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details.

The present invention provides for a system and methodology for increasing number of organic memory cells associated with a lithographic feature, wherein memory elements are formed on sidewalls of the lithographic feature.

Such a multi-cell and multi-layer organic memory component can be formed with two or more electrodes having a selectively conductive media between the electrodes forming individual cells, while employing a partitioning component to enable lateral stacking of additional memory cells adjacent or in association with previously formed cells. The cells of the organic memory device are operative to be of two or more states corresponding to various levels of impedance. These states are set by applying a bias voltage and then the cells remain in their respective states until another voltage, in reverse bias, is applied. The cells maintain their states with or without power (e.g., non-volatile) and can be read either electrically or optically by measuring injection current or light emission. The organic memory device of the present invention facilitates increases in device density whilst also increasing device performance relative to conventional inorganic memory device.

Additionally, the organic memory device of the present invention employs electronic stimulation (e.g., flow of electrons and holes) instead of ions and/or electric fields. Thus, the organic memory device can have better performance and/or a quicker response to changes in stimuli as compared to other types of memory devices.

Referring to FIG. 1, a perspective diagram of an organic memory device in accordance with an aspect of the present invention is depicted. The memory device includes a first electrode 104, a passive layer 106, an organic polymer layer 108, and a second electrode 110. The diagram also illustrates a voltage source 102 connected to the first electrode 104 and the second electrode 110 that applies a voltage on the first electrode 104 and the second electrode 110.

The first electrode 104 and the second electrode 110 are comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal suicides, and the like. Exemplary alloys that can be utilized for the conductive silicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the first electrode 104 and the second electrode 110 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 108 and the passive layer 106 are collectively referred to as a selectively conductive media or selectively conductive layer. The conductive properties of this media (e.g., conductive, non-conductive, semi-conductive) can be modified in a controlled manner by applying various voltages across the media via the electrodes 104 and 110.

The organic layer 108 is comprised of a conjugated organic material, such as a small organic molecule and a conjugated polymer. If the organic layer is polymer, a polymer backbone of the conjugated organic polymer may extend lengthwise between the electrodes 104 and 110 (e.g., generally substantially perpendicular to the inner, facing surfaces of the electrodes 104 and 110). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt). A more detailed discussion of the composition of the organic layer 108 is described infra.

The organic layer 108 has a suitable thickness that depends upon the chosen implementations and/or the memory device being fabricated. Some suitable exemplary ranges of thickness for the organic polymer layer 108 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic layer 108 can be formed via a number of suitable techniques. One suitable technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometime it may have a chemical bond formed between the conjugated organic polymer and the passive layer 106.

The passive layer 106 contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 108. The particular conductivity facilitating compound employed is selected so that the two relatively stable states match with the two relatively stable states of the conjugated organic molecule of the layer 108.

The passive layer 106 is operative to transport charge from the first electrode 104 to the interface between the organic layer 108 and the passive layer 106. Additionally, the passive layer 106 facilitates charge carrier (e.g., electrons or holes) injection into the organic layer 108 and increases the concentration of the charge carrier in the organic layer resulting in a modification of the conductivity of the organic layer 108. Furthermore, the passive layer 106 can also store opposite charges in the passive layer 106 in order to balance the total charge of the device 100.

The passive layer 106 can in some instances act as a catalyst when forming the organic layer 108. In this connection, the backbone of the conjugated organic molecule may initially form adjacent the passive layer 106, and grow or assemble away and substantially perpendicular to the passive layer surface. As a result, the backbones of the conjugated organic molecule may be self aligned in a direction that traverses the two electrodes.

Examples of conductivity facilitating compounds that may make up the passive layer 106 include one or more of copper sulfide ($Cu_2S$, $CuS$), copper oxide ($CuO$, $Cu_2O$), manganese oxide ($MnO_2$), titanium dioxide ($TiO_2$), indium oxide ($I_3O_4$), silver sulfide ($Ag_2S$, $AgS$), iron oxide ($Fe_3O_4$), and the like. The passive layer 106 may be grown using oxidation techniques, formed via gas phase reactions, or deposited between the electrodes.

The passive layer 106 has a suitable thickness that can vary based on the implementation and/or memory device being fabricated. Some examples of suitable thicknesses for the passive layer 106 are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

In order to facilitate operation of the organic memory device, the organic layer 108 is generally thicker than the passive layer 106. In one aspect, the thickness of the organic layer is from about 0.1 to about 500 times greater than the thickness of the passive layer. It is appreciated that other suitable ratios can be employed in accordance with the present invention.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 110 through the selectively conductive media to the first electrode 104 based on a voltage applied to the electrodes by the voltage source 102 if the organic layer is n-type conductor. Alternately, holes flow from the first electrode 104 to second electrode 110 if the organic layer 108 is p-type conductor, or both electrons and holes flow in the organic layer if it can be both n and p type with proper energy band match with 106 and 110. As such, current flows from the first electrode 104 to the second electrode 110 via the selectively conductive media.

Switching the organic memory device to a particular state is referred to as programming or writing. Programming is accomplished by applying a particular voltage (e.g., 9 volts, 2 volts, 1 volts, . . . ) across the selectively conductive media via the electrodes 104 and 110. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the organic memory device, the thickness of the various layers, and the like. The voltage supply 102 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 2 volts, 1 volts, 0.5 volts) is applied via the voltage source 102. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

Now referring to FIG. 1(*a*), various memory cells 115 are illustrated that can be laterally stacked in accordance with the present invention to facilitate high-density memory structures, wherein various stacks can be similarly constructed in parallel within a memory device or integrated circuit (IC). To facilitate such lateral stacking, as depicted a thin film diode (TFD), for example, can be provided as a partitioning component that separates layers and facilitates access thereto.

FIG. 2 is a block diagram that depicts fabrication of a passive layer 200 in accordance with an aspect of the present invention. A $Cu_yS$ layer is formed by a gas phase reaction operation. A first layer 206 is formed that comprises Cu. A second layer 204 is formed on the first layer. The second layer comprises $Cu_yS$ (e.g., $Cu_2S$, CuS or mixture thereof) and has a thickness of about 20 Å or more. A third layer 202 is formed on the second layer 204. The third layer 202 contains $Cu_2O$, and/or CuO and generally has a thickness of about 10 Å or less. It is appreciated that alternate aspects of the invention can employ suitable variations in composition and thickness and still be in accordance with the present invention.

FIG. 3 is a block diagram illustrating an organic layer 300 formed by a chemical vapor deposition (CVD) process in accordance with an aspect of the present invention. The organic layer 300 is formed via a gas phase reaction process. Typically, the organic layer 300 is formed in contact with a passive layer and an electrode. The organic layer 300 is comprised of polymer polydiphenylacetylene (DPA). This polymer layer, as shown in FIG. 3, is fabricated to be about 65 Å thick.

Turning now to FIG. 4, a block diagram depicting another organic layer 400 formed from a CVD process in accordance with an aspect of the present invention is illustrated. Once again, the organic layer 402 is formed via a gas phase reaction process. The organic layer 402 is formed in contact with a passive layer and an electrode. The organic polymer layer 402 is comprised of polymer polyphenylacetylene (PPA). Referring to FIG. 5, a block diagram of another organic layer 500 formed by spin coating in accordance with an aspect of the present invention is illustrated. The organic layer 500 is formed via a spin coating process, instead of a gas phase reaction process. The organic layer 500 is formed in contact with a passive layer and an electrode. The organic layer 500 is comprised substantially of PPA and has a thickness of about 1000 Å.

Experimental results tend to show that organic layers formed via spin coating yield a more reliable polymer layer than polymer layers formed via CVD. This may be due to the presence of oxygen and lack of control of heat generated by polymerization under CVD. It is appreciated that controlling heat and oxygen during polymerization for CVD processes can improve the resulting polymer layer. Additionally, organic layers created via CVD are generally thinner than those created with other methods.

It is appreciated that various alternatives to and variations of the layers described in FIG. 2–5 can be employed in accordance with the present invention.

The passive layer (e.g., CuS) employed in organic memory devices plays an important role. Its presence significantly improves the conductivity of the organic layer. This characteristic is at least partially a function of the following: charge carrier generated by Cus, build up of a charge depletion layer, charge carrier distribution in organic material, and memory loss due to charge carrier redistribution after reversing electric field. The discussion infra describes and illustrates charge carrier concentration and models behavior of organic memory devices.

In the following example, conductive polymer is used as organic material, and CuS is used as passive layer material. With respect to charge carrier generation, the copper in CuS is at its highest oxidation state Cu(II). It has relatively strong capability to gain electrons from a contacting polymer and yields the following equation:

$$Cu(II)S + Polymer \rightarrow Cu(I)S^- + Polymer^+ \quad (1)$$

The consequence is that an intrinsic field is produced due to the charges accumulated on the interface between CuS and polymer. This is shown in FIG. 6, which is a graph depicting the effect of an intrinsic electric field on an interface between Cu(y)S and a polymer is provided. The oxidized polymer (Polymer$^+$) is the charge carrier when external field is applied. The conductivity of polymer is determined by its concentration and its mobility.

$$\sigma = qp\mu \quad (2)$$

Where q is the charge of the carrier, p is carrier concentration and $\mu$ is the mobility.

Referring now to the charge depletion layer, employing a similar concept as applied with respect to semiconductors, a potential function can be expressed as:

$$V(x) = qN_p(d_p x - x^2/2)/\epsilon \quad (3)$$

where $N_p$ is the average concentration of charge carrier, $\epsilon$ is the dielectric constant of the polymer, and $d_p$ is the width of the charge depletion. $N_p$ can be obtained by employing the following equation:

$$d_p = \left[\frac{2\epsilon(V_b \pm V)}{qN_p}\right]^{1/2} \quad (4)$$

where V is the external field voltage applied. For forward voltage, it is "−" sign. For the reverse voltage, it is "+" sign.

The voltage function of Eq. (3) can be approximated to simplify the derivation.

With respect to charge carrier distribution, like p-doping of a semiconductor, two processes typically take place in the electric field. This flux can be expressed as:

$$J = -qD\frac{dp}{dx} + q\mu pE \quad (5)$$

where D is diffusion constant of the charge carrier, and E is the electric field at x. If there is no current, the carrier distribution is:

$$p(x) = p(0)\exp([(V(0) - V(x))/V_t]) \quad (6)$$

where p(0) is the concentration, V(0) is voltage at the interface respectively, and $V_t = kT/q$.

When forward voltage is so large that the current flux J>0, the analytical equation can be derived for steady state flow with some assumption for the voltage distribution in the cell. Overall, under forward voltage, the charge distribution p(x) is an increase function of x. When reverse voltage is applied, $V(x) > V_0$, the charge concentration is a decrease function of x.

The final characteristic, retention time, refers to the fact that a forward voltage produces more charge carrier and the charge carrier accumulates more on the other end of the passive (CuS) layer (away from the organic polymer). However, this charge carrier concentration will be set back once the voltage is removed, which includes two processes: charge carrier diffusion toward the CuS layer and charge carrier recombination on the interface.

Fick's Law can describe the 1st process, charge carrier diffusion toward the CuS layer. The charge carrier recombination can be described as follows:

$$Cu(I)S^- + Polymer^+ \rightarrow Cu(II)S + Polymer \quad (7)$$

The retention time is the time required to redistribute the charge carrier to the original state. It is likely that the reaction rate is relatively faster than diffusion rate. Therefore, the retention time can be substantially determined by the diffusion process only.

An exemplary memory cell is considered herein with respect to the equations 1–9 discussed supra and illustrated in FIG. 7–12. The exemplary cell is considered with parameters intrinsic voltage $V_b$=0.02V, equilibrium constant $K_{eq}$=2.17×10$^{-4}$, concentration of CuS and Polymer at interface [Polymer]$_0$=[CuS]$_0$=10$^{23}$/cm$^3$, polymer thickness d=5× 10$^{-5}$ cm (0.5 um), and CuS thickness $d_{CuS}$=5×10$^{-7}$ cm (0.005 um). Six typical cases are calculated to illustrate electrical operation of an organic memory device in accordance with an aspect of the present invention.

Figure 7:
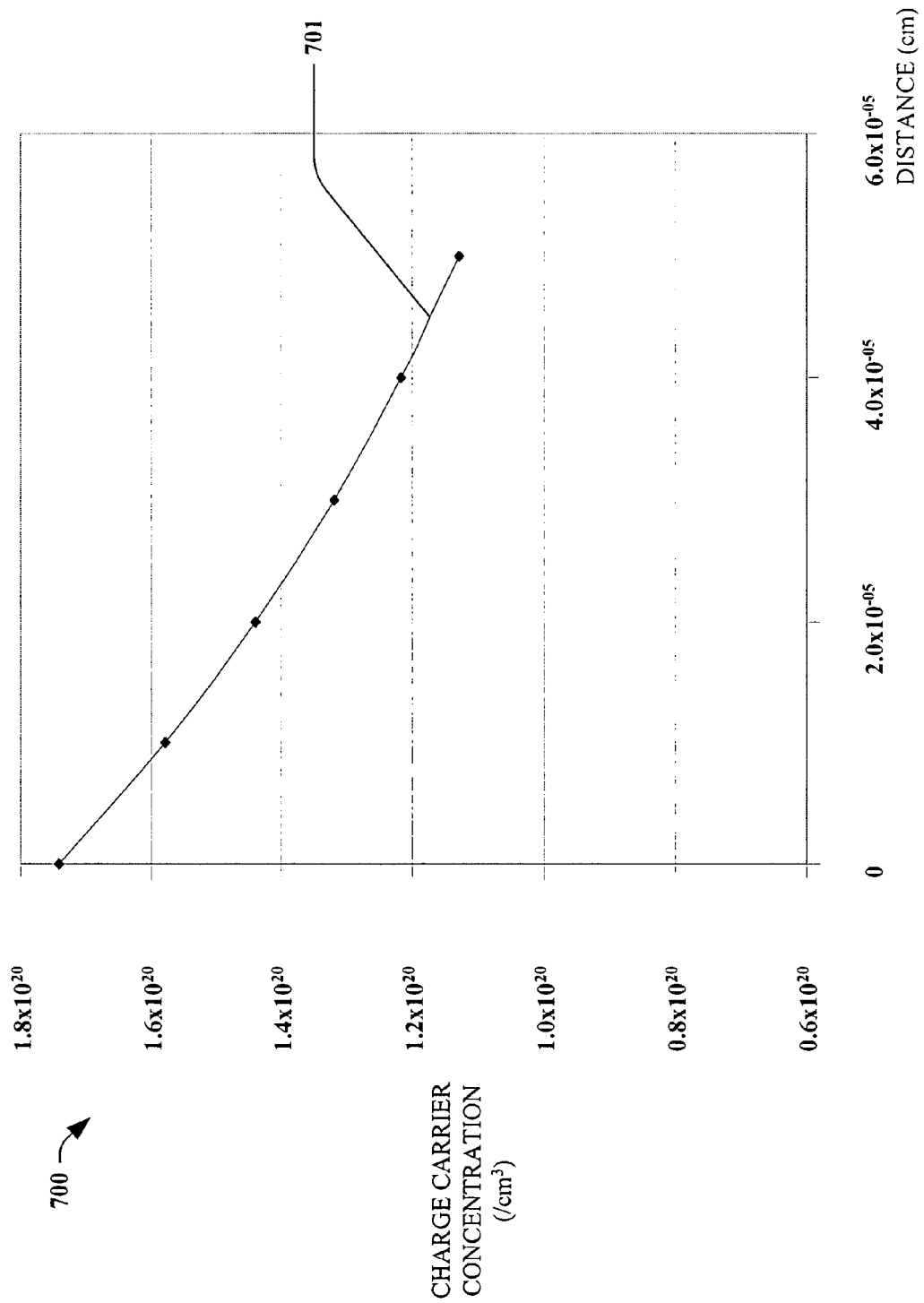
FIG. 7 is a graph illustrating charge carrier distribution of an exemplary memory cell in accordance with an aspect of the present invention.

FIG. 7 depicts a graph 700 of charge carrier distribution 701 of the exemplary memory cell as a function of distance from the CuS and organic polymer interface in accordance with an aspect of the invention. The charge carrier concentration 701 is shown as being a decreasing function of distance (x) from the interface. This graph 700 assumes an external voltage V=0 and a current J=0. The charge carrier concentration 701 is derived utilizing Eq. 6 with a constant field assumption. However, the points shown are independent of the constant field assumption.

Figure 8:
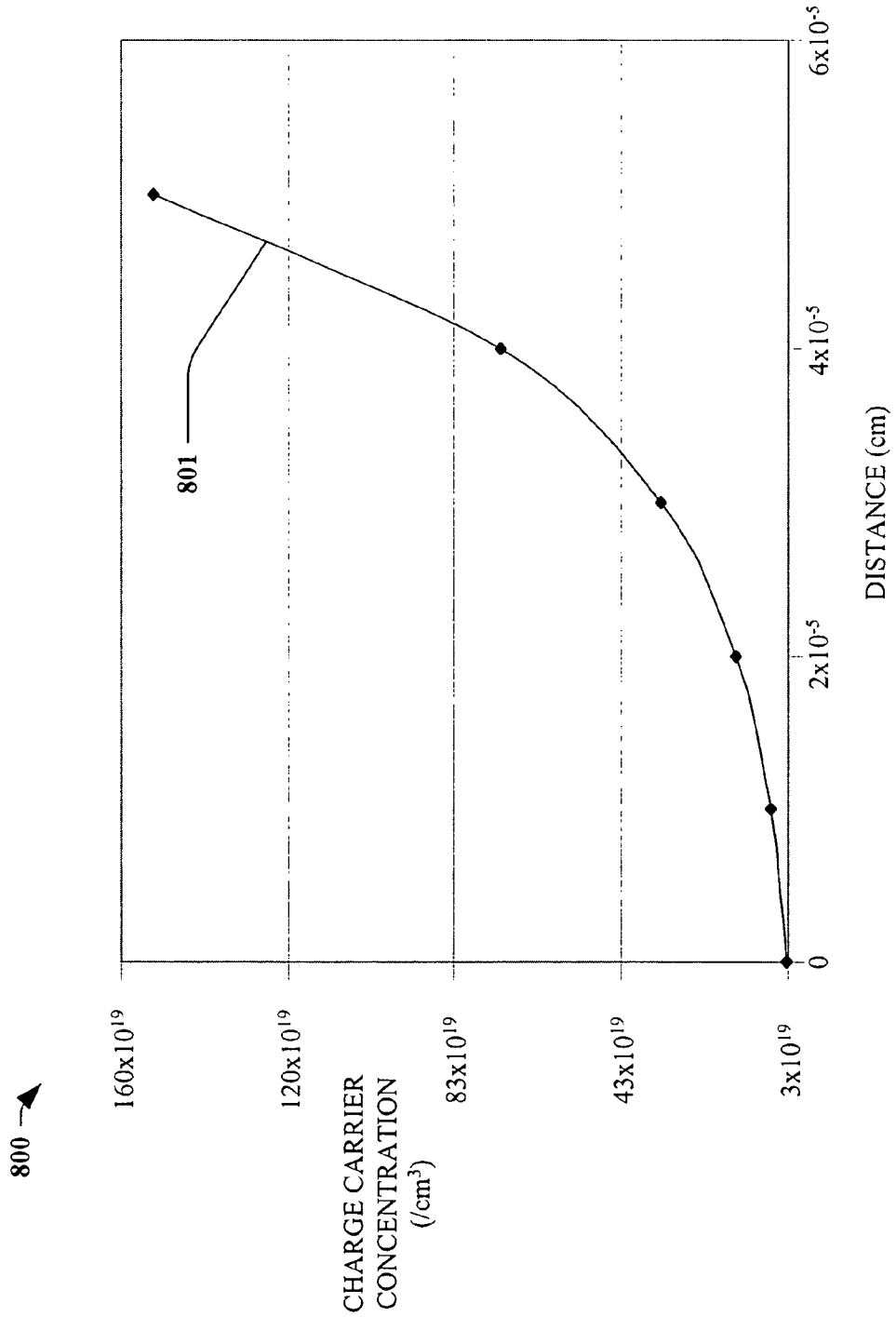
FIG. 8 is a graph illustrating charge carrier distribution of an exemplary memory cell in accordance with an aspect of the present invention.

Turning now to FIG. 8, another graph 800 illustrating charge carrier distribution 801 for the exemplary organic memory cell is depicted in accordance with an aspect of the present invention. For this graph 800, parameters are set as follows: forward voltage=0.12V and current flux J=0. The CuS end has a higher voltage than the other end (organic polymer). This drives the charge carrier away from CuS layer and leads to charge carrier concentration that has an increase function of x. Even at lowest concentration p(0), it is not a small value for this case (e.g., its value is 3.32× 10$^{19}$/cm$^3$ for the case shown in FIG. 8). This explains why the polymer is a good conductor when forward voltage is applied. Again, it is Eq. 6 with constant electric field model used for the plot. The points demonstrated are independent of constant electric field assumption.

Figure 9:
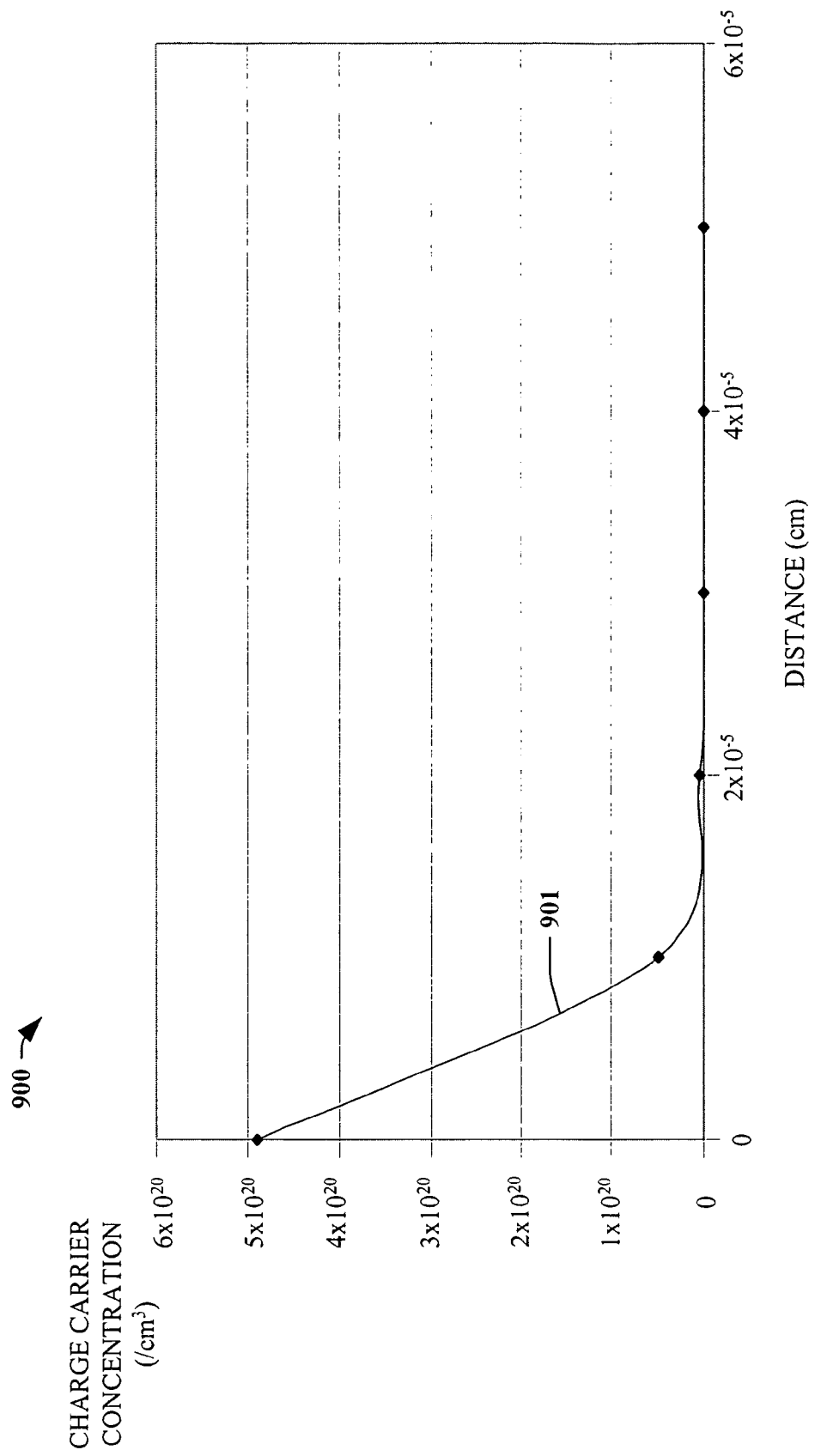
FIG. 9 is a graph illustrating charge carrier distribution of an exemplary memory cell in accordance with an aspect of the present invention.
Figure 10:
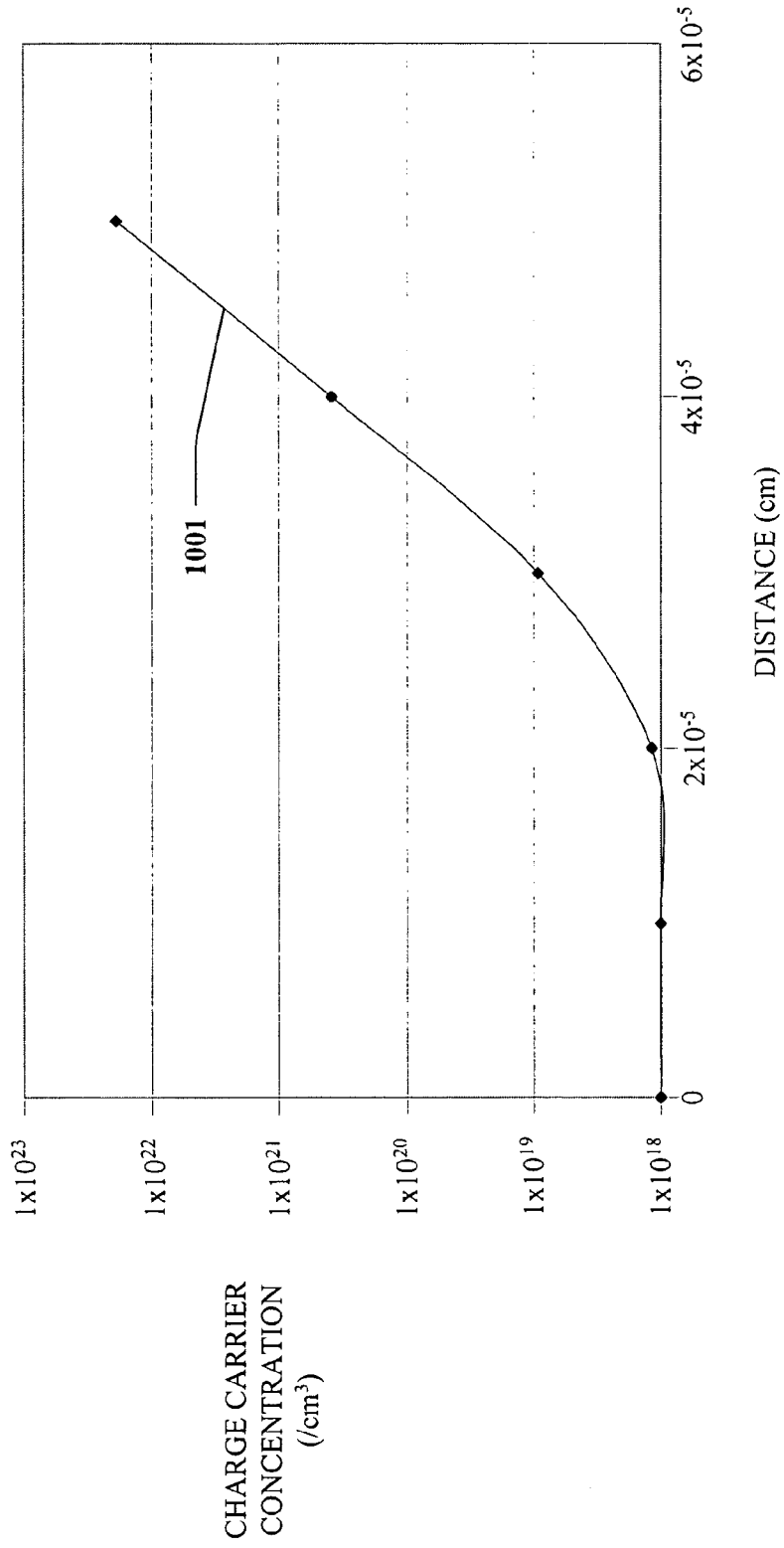
FIG. 10 is a graph illustrating charge carrier distribution of an exemplary memory cell in accordance with an aspect of the present invention.

FIG. 9 depicts yet another graph 900 of charge carrier distribution 901 of the exemplary memory cell as a function of distance from the CuS and organic polymer interface in accordance with an aspect of the invention. For this graph, the parameters are set such that the reverse voltage=0.28V and the current J=0. With reversed voltage, the charge carrier is concentrated at the CuS polymer interface and drops quickly to small concentration when it is away from the interface, which describes why the organic memory cell becomes non-conductive when high reversed voltage applied. Again, Eq. 6 with constant electric field model is assumed for the plot. The points demonstrated are independent of this assumption. Referring now to FIG. 10, another graph 1000 that depicts charge carrier distribution 1001 of the exemplary memory cell as a function of distance in accordance with an aspect of the present invention is provided. For this graph 1000, parameters are set as follows: forward voltage=0.52V and current flux J>0 ($p_j$=10$^{18}$/cm$^3$). When current flux J>0, the charge carrier is still an increase function of x because the forward voltage drives the charge carrier away from CuS interface. One important point is that the lowest concentration p(x) is at interface.

Figure 11:
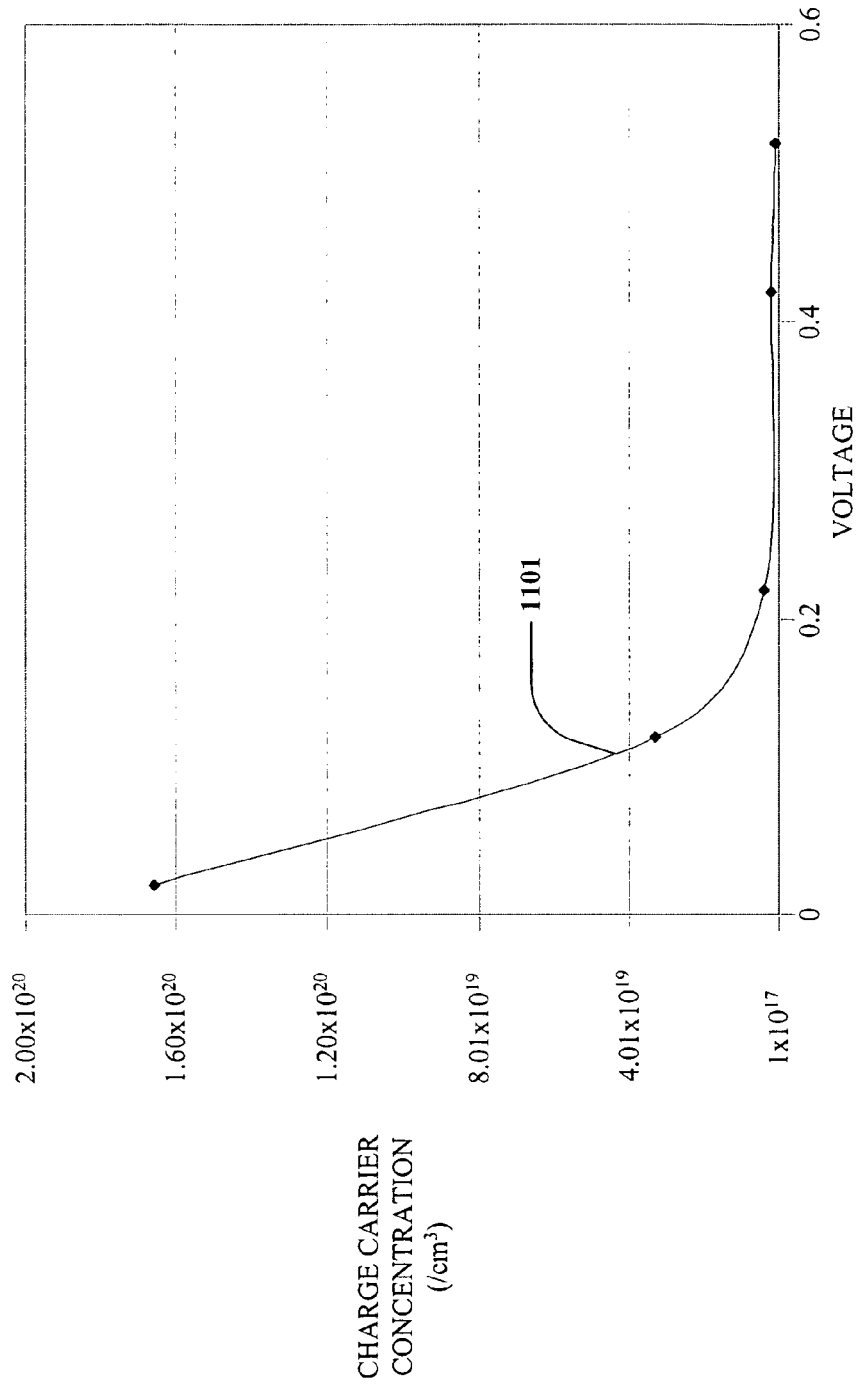
FIG. 11 is a graph illustrating charge carrier concentration at the interface of an exemplary memory cell in accordance with an aspect of the present invention.

FIG. 11 depicts yet another graph 1100 of charge carrier concentration at interface 1101 of the exemplary memory cell as function of forward voltage V. For this graph, the parameters are set such that J>0 ($p_j$=10$^{18}$/cm$^3$) and assumes a constant electric field model. This model assumes the electric field in the cell is constant. Therefore, the voltage V(x) is described as a linear function. This model is applicable when the diffusion constant of the polymer is small and there is constant electric resistance. With this model, the charge carrier concentration at interface is derived as function of voltage. It is noted that $p_0$(V) tends to be constant after forward voltage is large enough and the current is controlled by the charge carrier not charge injection at the interface. As such, p(0) can be rewritten as:

$$p(0) = \frac{1}{2}\left\{-K_{eq}[Polymer]_0 + \sqrt{(K_{eq}[Polymer]_0)^2 + \frac{4d_{CuS}K_{eq}[Polymer]_0[CuS]_0}{d}}\right\} \quad (10)$$

This Eq. 10 shows that limiting p(0) is an increase function of thickness ratio between CuS layer and polymer layer.

Figure 12:
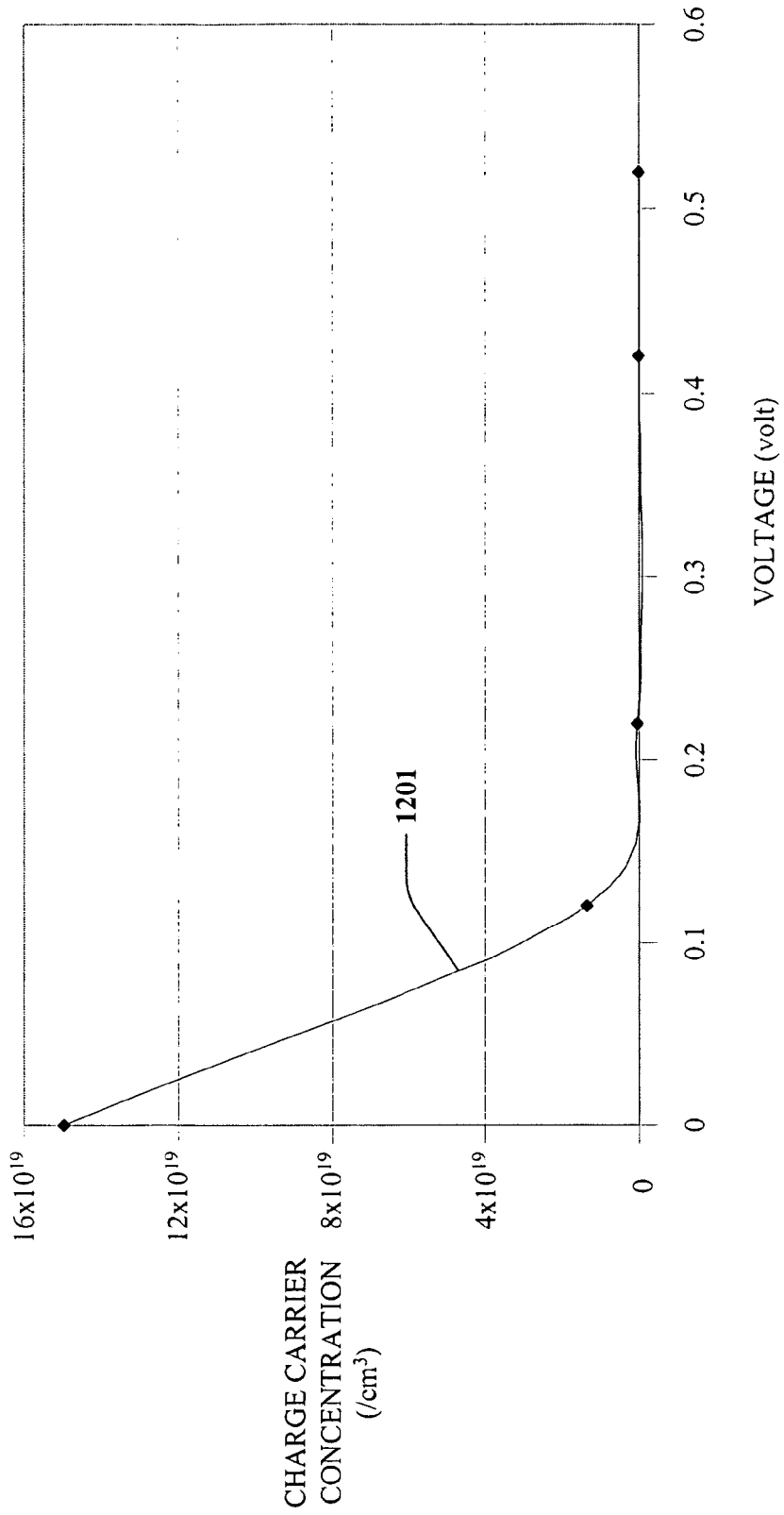
FIG. 12 is a graph illustrating charge carrier concentration at the interface of an exemplary memory cell in accordance with an aspect of the present invention.

FIG. 12 illustrates another graph 1200 that depicts charge carrier concentration at the interface 1201 of the exemplary memory cell as function of forward voltage Vin accordance with an aspect of the present invention is provided. For this graph 1200, p(0) is a function of forward voltage, current J, which may or may not be>0, and a step potential function model. This model assumes the voltage V(x) function can be described by a step function. The model is applicable when the diffusion constant of the polymer is very large. Therefore, the electric resistance in the cell is trivial. With this model, the charge carrier concentration at interface is derived as the function of voltage. It is noted that in FIG. 12 that $p_0$(V) tends to be zero after forward voltage is large enough. When the charge carrier at the interface controls the current flux, this value is a function of voltage. This zero limit behavior is due to the interface boundary limit set by the reaction (1). Basically, the fast charge carrier transportation from the interface to the other end reaches the supply limit. Thus, the limiting p(0) is also rewritten as:

$$p(0) = \frac{1}{2}\left\{-K_{eq}[Polymer]_0 + \sqrt{(K_{eq}[Polymer]_0)^2 + \frac{4d_{CuS}K_{eq}[Polymer]_0[CuS]_0}{d\left[\exp\frac{V(0)-V}{V_t} - \frac{V(0)-V}{V_t}\right]}}\right\} \quad (11)$$

Again p(0) is an increase function of thickness ratio between CuS layer and polymer layer.

Regarding the above discussion, it is important to note that the flux measured is determined by charge carrier drift when limiting flux is in the polymer. Under constant electric field assumption, the function to describe the charge carrier concentration is p(x). $p_j$=p(0) is met when the polymer determines limiting flux since the lowest concentration in the cell is at the interface. This condition results in a constant p(x). This means the diffusion contribution to the flux in Eq. 5 is zero. Under step potential assumption, another function is employed to describe the charge carrier concentration p(x). The initial charge carrier concentration p(0) has a relatively substantially smaller value than other regions. Therefore, J is still determined by p(0). Another point that is noted regards boundary conditions. Unlike semiconductors, it is just applicable to the concentration at interface, not everywhere. This boundary condition limits the total amount of the charge carrier produced in the cell.

The equations supra (E.q. 1–7) and the FIGS. 9–12 describe and model behavior of organic memory devices. This model can be employed to explain measured data and can be for other passive layer materials aside from CuS. Additionally, the model can be used to think about how to improve retention and response time and to design the other devices such as transistor. Further, the model can be employed to develop various threshold voltages that set conductivity levels (e.g., set states), read conductivity levels and erase the conductivity levels thus performing memory device operations of writing or programming, reading and erasing.

Figure 13:
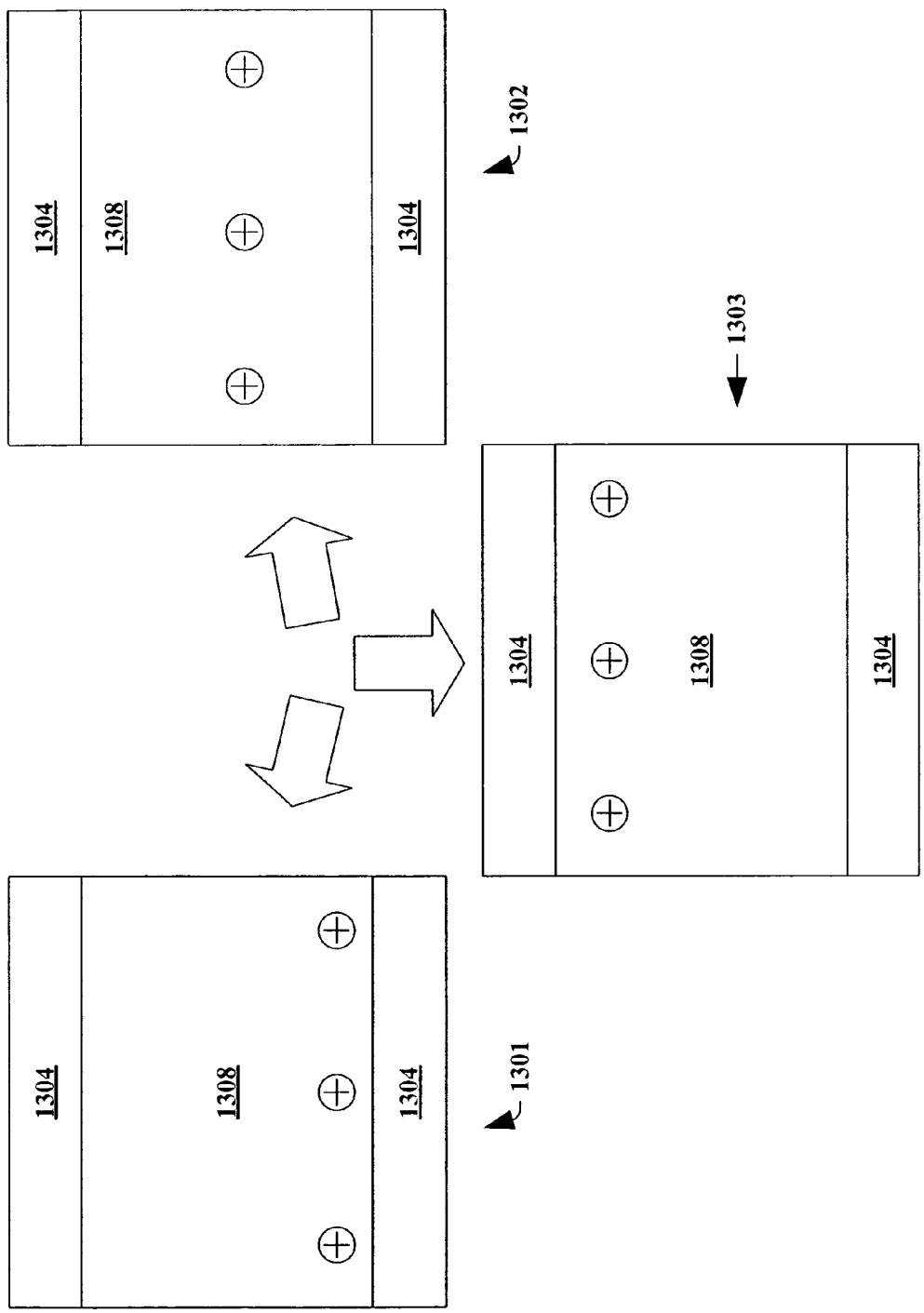
FIG. 13 is a block diagram depicting an organic memory device in various states in accordance with an aspect of the present invention.

FIG. 13 is a block diagram that illustrates an organic memory device 1300 in various states in accordance with an aspect of the present invention. The device 1300 is depicted in a first "off" state 1301, an "on" state 1302, and a second "off" state 1303. It is appreciated that memory devices formed in accordance with the present invention can have other states than those depicted in FIG. 13. The organic memory device 1300 comprises a top electrode 1304, a bottom electrode 1306 and a selectively conductive layer 1308 comprising an organic layer (e.g., PPA) and at least one passive layer (e.g., CuS).

In the first off state 1301, a positive charge 1310 collects in the selectively conductive layer 1308 near the bottom electrode 1306. In the on state 1302, the positive charge 1310 is uniformly distributed thereby indicating an on state. In the second off state 1303, the positive charge collects in the selectively conductive layer 1308 near the top electrode 1304.

Figure 14:
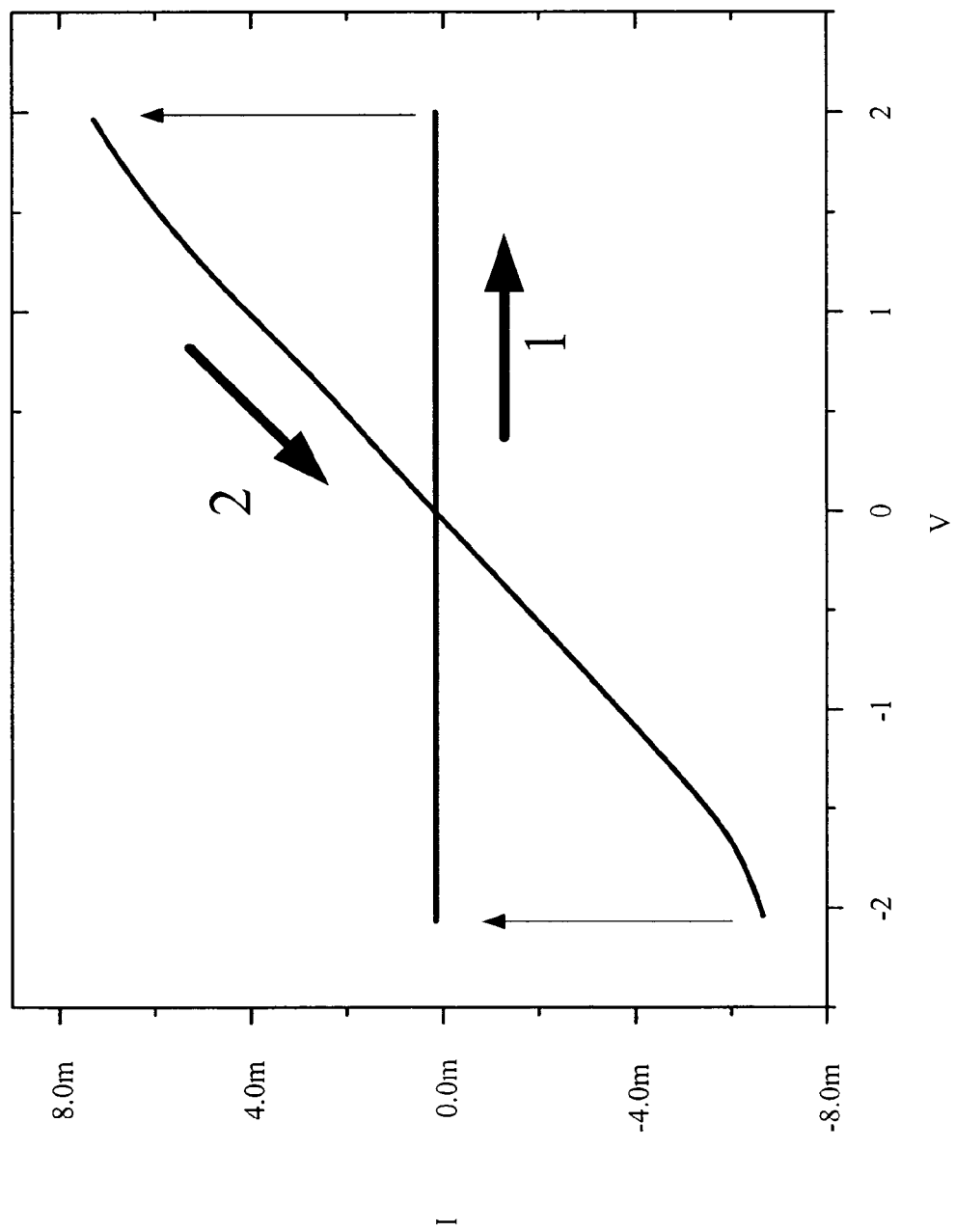
FIG. 14 is a graph illustrating I–V characteristics for an organic memory device in accordance with an aspect of the present invention.

FIG. 14 is a graph 1400 that illustrates I–V characteristics for the memory device 1300 described with respect to FIG. 13. It can be seen that from state 1, which indicates "off", the device can be modified to be in state 2, which indicates "on", by applying a positive voltage of 2V. Additionally, it can be seen that whilst in state 1, the organic memory device has a high impedance and low conductance. Subsequently, the device 1300 can be modified to change from state 2 to state 1 by application of a negative voltage, therein causing a reverse current until the state 1 is obtained.

Figure 15:
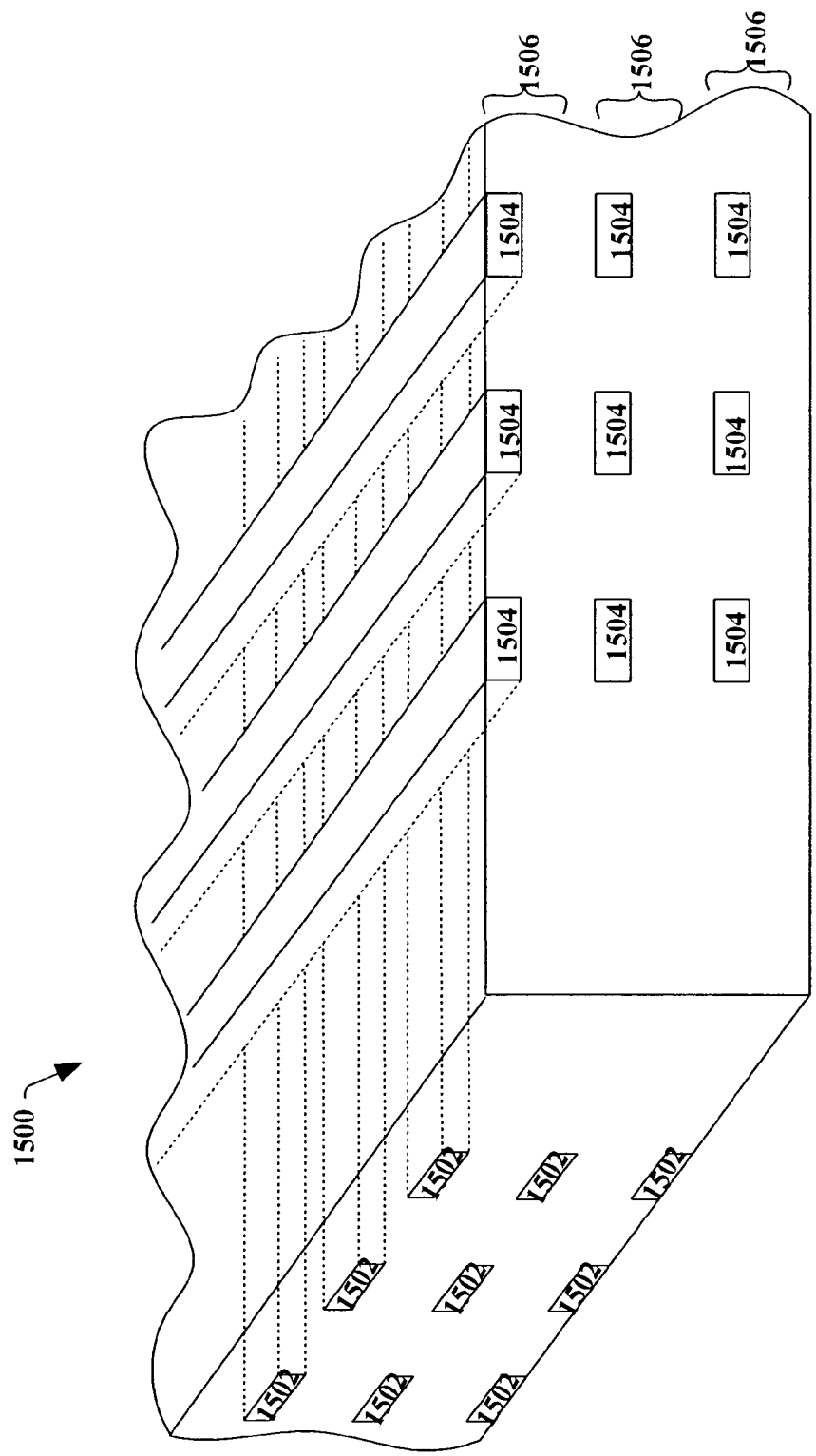
FIG. 15 is a three dimensional view of an organic memory device in accordance with an aspect of the present invention.

Referring to FIG. 15, a three dimensional view of an organic memory device 1500 containing a plurality of organic memory cells in accordance with an aspect of the invention is shown. The organic memory device 1500 contains a plurality of first electrodes 1502, a plurality of second electrodes 1504, and a plurality of memory cell layers 1506. Between the respective first and second electrodes are the controllably conductive media (not shown). The plurality of first electrodes 1502 and the plurality of second electrodes 1504 are shown in substantially perpendicular orientation, although other orientations are possible. The three dimensional microelectronic organic memory device is capable of containing an extremely high number of memory cells thereby improving device density. Peripheral circuitry and devices are not shown for brevity.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Referring now to FIG. 16(*a*) thru 16(*i*), various stages of the formation of side wall memory cells according to one or more aspects of the present invention is illustrated.

In general, wafer processing hinges on employment of a lithographic process to create the fine featured patterns of the integrated circuit. Each layer of the chip is defined by a specific mask, and there are typically 16 to 24 mask layers in each IC. The mask can be made by patterning a film of chromium on a pure quartz glass plate to form the reticles. The patterns are formed on the chromium plated quartz plate by removing the chromium with either laser or electron-beam driven tools. The reticle is exposed step by step over the wafer. The wafer with patterned photoresist is then put into an oxide etch process to remove the oxide where there is no pattern. This has the effect of transferring the pattern to the oxide, creating barriers of oxide where it is not desired for subsequent processes to impact the silicon below. The etch may be either a classic wet chemistry or a "dry" etch which uses gas excited by a radio frequency generator to and excited plasma state. The photoresist is then stripped away by employing wet and dry strippers.

In FIG. 16(*a*), initially a bit line 610 having an associated barrier is formed according to an inlay process over a substrate layer 612, such that the bit line pattern protrudes out of the silicon surface. This bit line protrusion, in effect, forms the bottom electrode 104 of FIG. 1. FIG. 16(*b*) illustrates the formation of the selective conductive layer, which as described supra can be deposited by plasma enhanced chemical vapor deposition 615, thus forming the layer 617 of FIG. 16(*c*). Layer 617 can be deposited in a dune shape or multi edged structure over the bit line 610 and substrate 612.

To form a thin film of the passive layer from copper sulfide ($Cu_2S$, CuS), for example, a gaseous form of copper sulfide is introduced (615) above the conductive layer 610, with helium optionally being utilized as a carrier gas. A metal organic gas precursor can be employed in the process, which is activated by a constant power rf excitation source to generate a plasma. Application of the metal organic precursor mitigates the need for highly toxic hydrogen sulfide ($H_2S$) within the process. The metal organic precursor can be, for example, chelate Cu(II) diethyldithiocarbamate or $CU(S_2CN(C_2H_5)_2)_2(II)$. The process can transpire under relatively low pressure and temperature conditions (e.g., about 0.2 Pa. and between about 473 to 573 K, respectively).

Next and as depicted in FIG. 16(*d*), the formed layer 617 is subject to an etching process 620. In one aspect of the present invention, the etching process is performed horizontally, as to form the selective conductive layer 622 that partially encapsulates the bit line 610 as illustrated in FIG. 16(*e*). As stated earlier, the encapsulating layer 622 can be a multi layer comprising a passive layer and an organic memory layer.

Also, the etch process can be controlled, for example such that the layer 610 and 622 can share the same height and an even horizontal surface can be created. Put differently, the etching process 620 can remove the horizontal portion of the encapsulating layer 622, such that the bit line protrusion is sandwiched between the two strips of the selective conductive material, which are created on the lateral sides of bit line 610. A CMP process can also be employed in conjunction with the etching process.

Next, by referring to FIG. 16(*f*), upon the structure 630, a top electrode layer is deposited (635). This forms a dune shape or ridge 640 there upon, as depicted in FIG. 16(*g*). This can provide for a plurality of edges to be shared between the top electrode layer and the cell structure. In effect, the selective conductive layer 622 is now being sandwiched between the bit line protrusion 610 from one side, and the top electrode layer 640 from the other side.

Next, as depicted in FIG. 16(*h*) and FIG. 16(*i*), by employing an etching process, the horizontal surface for the top electrode layer 640 is being etched away, as to form two electrode strips 642, each being stacked on one side of the cell structure, and thus forming a memory cell according to the present invention. In effect, the structure of the resulting memory cell allows for the bit line protrusion 610, (the lower electrode of the memory cell), to associate with two sets of memory elements, (each set comprising a selective conductive material 622 and a top electrode layer 642.) Put differently, two bits of memory cells are now available for each memory cell created according to the lithographic features of the present invention.

Figure 16A:
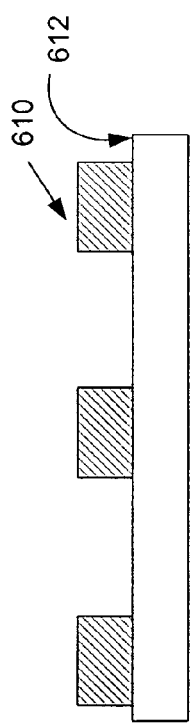
FIG. 16(a) thru 16(f) illustrate selected stages of the wafer processing to form side wall memory cells according to one aspect of the present invention.
Figure 16B:
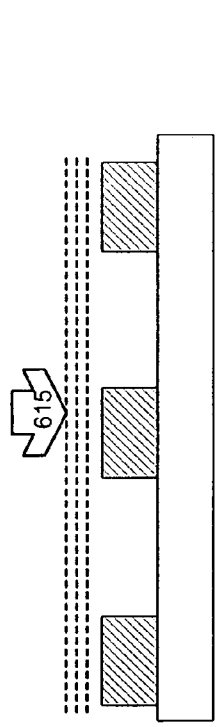
Figure 16C:
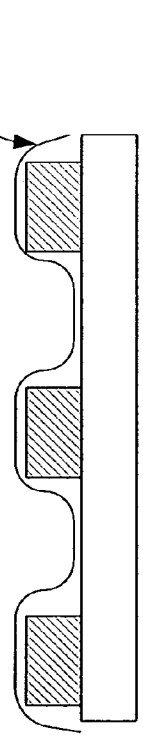
Figure 16D:
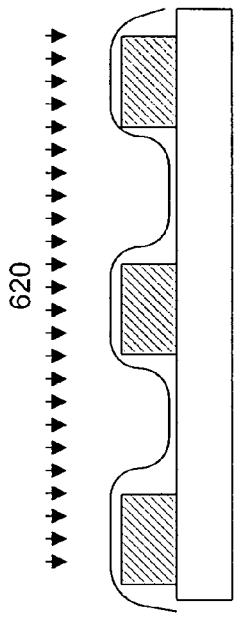
Figure 16E:
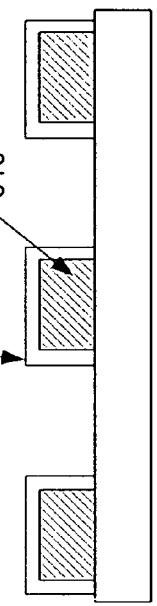
Figure 16F:
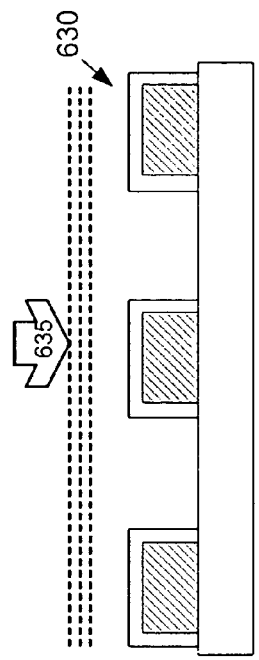
Figure 16G:
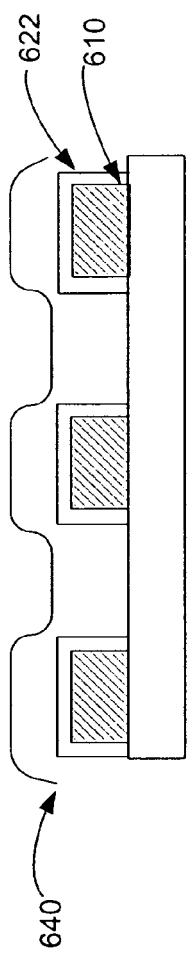
FIG. 16(g) thru 16(i) illustrate a continuation of the various stages of the wafer processing to form side wall memory cells according to one aspect of the present invention.
Figure 16H:
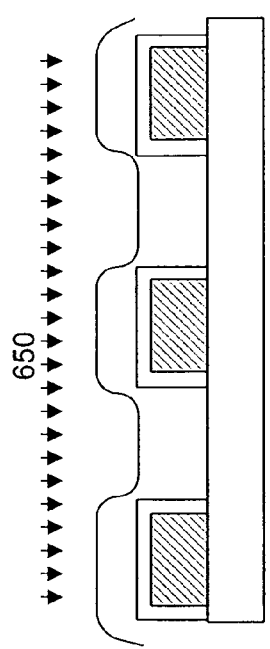
Figure 16I:
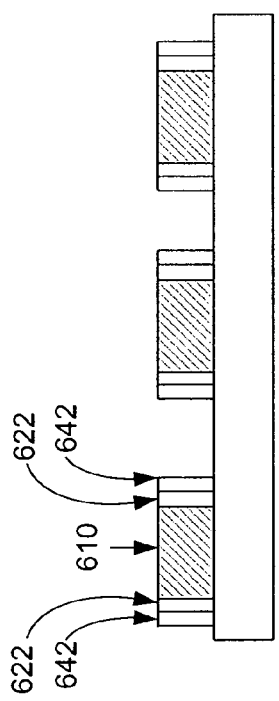
Figure 16J:
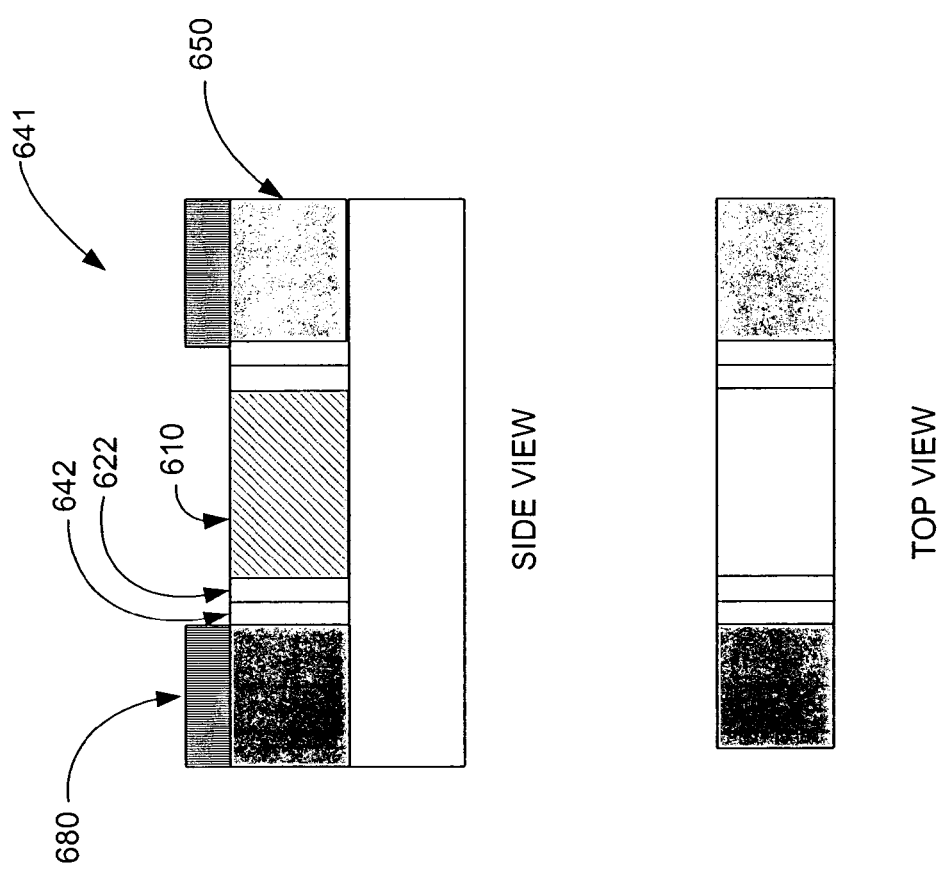
FIG. 16(j) illustrates a cross sectional view and a top view of a lithographic feature having a side wall memory cell formation according to one aspect of the present invention.
Figure 17:
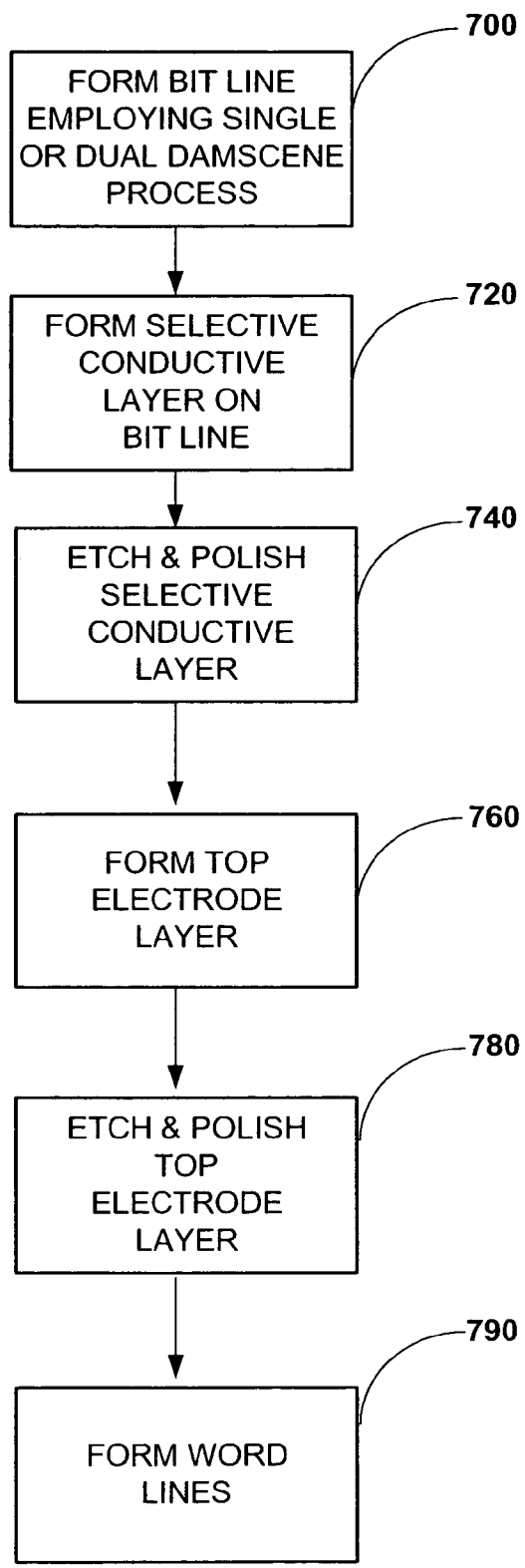
FIG. 17 illustrates a flow chart of the wafer processing methodology to form side wall memory cell in a lithographic feature according to one or more aspects of the present invention.

Referring now to FIG. 16*j*), a partial side and plan view of a memory cell according to one aspect of the present invention is illustrated. In this exemplary aspect of the invention, an Interlayer Dielectric Layer (ILD) 650 can be employed to fill a desired space between two adjacent memory cells. Upon this ILD layer a wordline 680 made from a conductive material, (e.g. Aluminum), may be formed. The intersection of a bitline 610 and a wordline 680 constitutes the address of a particular memory cell. Data can be stored in the memory cells (e.g., as a 0 or a 1) by choosing and sending signals to appropriate columns and rows in the array of memory cells. According to another aspect of the present invention, and as illustrated in the exemplary flow chart of FIG. 17, the etch and CMP process 740 is performed on the selective conductive layer before the act of forming the top electrode layer 740. The top electrode layer, in turn, is subject to another etch and polish process 780 at a later stage.

Figure 18:
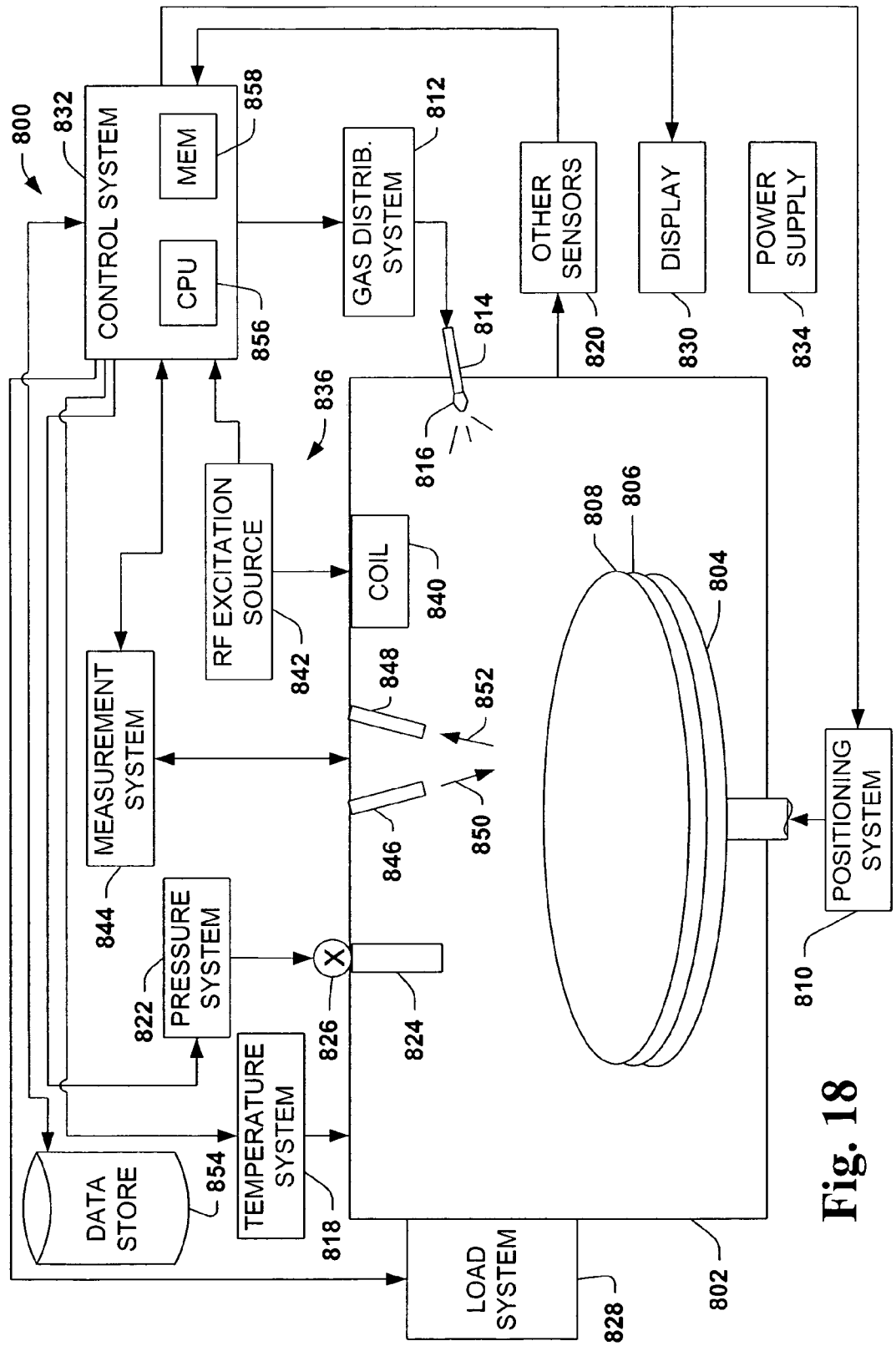
FIG. 18 is a schematic block diagram illustrating a system for depositing copper sulfide on a conductive layer in the manufacture of one or more memory cells in accordance with one or more aspects of the present invention.
Figure 19:
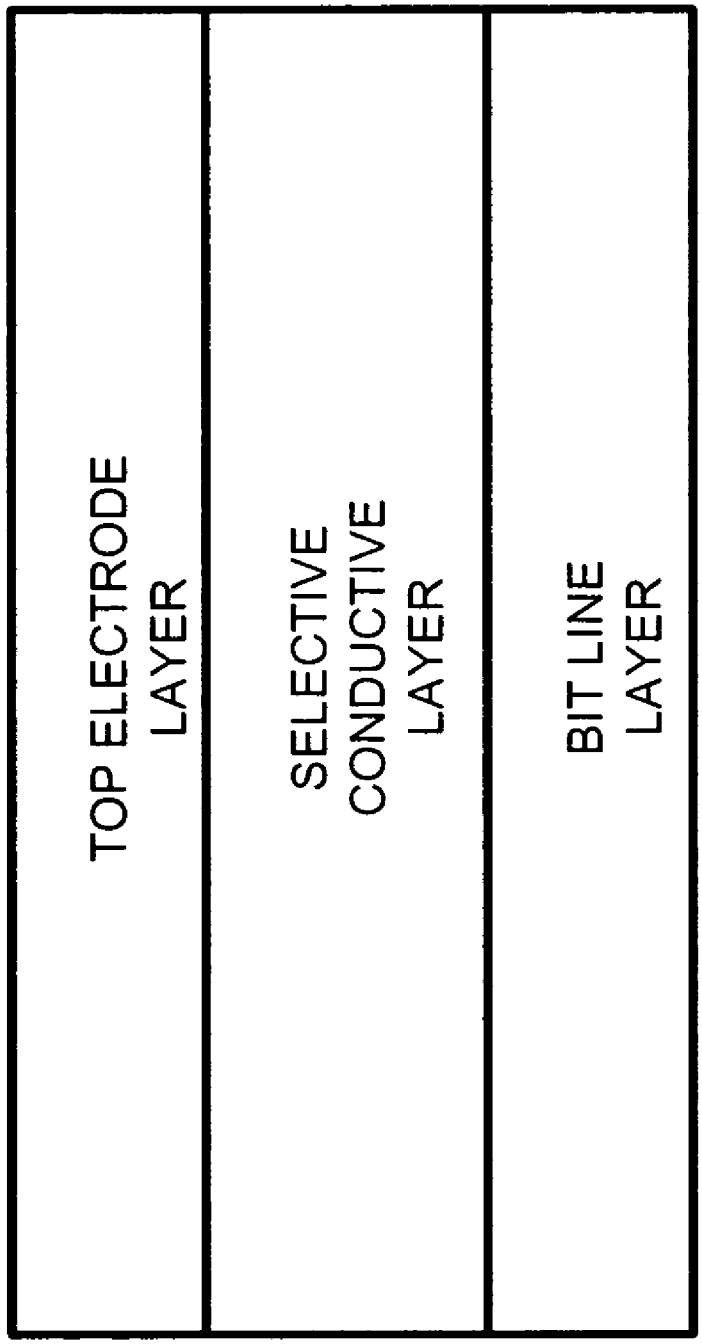
FIG. 19 is a schematic block diagram illustrating a conventional memory cell as known in the prior art.

Referring now to FIG. 18, a schematic block diagram is illustrated that depicts a system 800 for forming a thin film of conductivity facilitating material (e.g., copper sulfide ($Cu_2S$, Cus)) on a layer of conductive material (e.g., copper) in accordance with one or more aspects of the present invention, and more particularly via a plasma enhanced chemical vapor deposition process (PECVD) utilizing a metal organic gas precursor. It will be appreciated that formation rates may vary in response to factors including, but not limited to, gas compositions and/or concentrations, excitation voltages, temperatures and/or pressures. The formation described herein can be utilized as part of a semiconductor fabrication process wherein one or more memory cells are produced on a wafer.

The system 800 comprises a chamber 802 defined by a housing having a plurality of walls. The chamber 802 includes a support, such as may include a stage 804 (or chuck) operative to support a wafer 806 which comprises a layer of conductive material 808 upon which copper sulfide can be selectively formed as part of producing one or more memory cells. A positioning system 810 is operatively connected to the support 804 for selectively maneuvering the wafer 806 into desired positions within the chamber 802. It is to be appreciated that any suitable positioning system may be employed in accordance with one or more aspects of the present invention. It is to be further appreciated that the conductive material can be copper as well as any other suitable conductive material such as aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Examples of alloys that can be utilized for the conductive material include Hastelloy®, Kovar®, Invar, Monel®, Inconel®, brass, stainless steel, magnesium-silver alloy, and various other alloys.

A gas distribution system 812 is operatively coupled to the chamber 802 for selectively providing gaseous chemicals into the chamber at various rates, volumes, concentrations, etc. based upon, among other things, the amount (thickness) of film to be formed, the composition of film(s) to be formed, the pressure within the chamber, the temperature within the chamber and/or the size of the chamber, for example. By way of illustration, the gas distribution system 812 includes one or more sources of gaseous medium (a vapor) of one or more chemical(s). In the example illustrated, the gases are provided into the chamber through a conduit 814 that terminates in a nozzle 816. While, for purposes of brevity, a single nozzle 816 is shown in FIG. 8, it is to be appreciated that more than one nozzle or other gas delivery mechanisms may be utilized to provide gas into the chamber 802 at various mixtures and/or concentrations in accordance with one or more aspects of the present invention. For example, a shower head type gas delivery mechanism can be implemented to more evenly provide chemicals into the chamber above the wafer 806, which can facilitate a more uniform chemical vapor deposition on and across the wafer. The gas distribution system 812 injects a metal organic gas into the chamber to function as a precursor in the chemical vapor deposition process. The metal organic precursor can be, for example, chelate Cu(II) diethyldithiocarbamate or $Cu(S_2CN(C_2H_5)_2)_2)$ (II), which mitigates the need for highly toxic hydrogen sulfide ($H_2S$) within the process. A gaseous form of conductivity facilitating material, such as copper sulfide ($Cu_2S$, CuS), is also provided into the chamber for deposition onto the conductive layer. A gaseous form of helium can also be provided into the chamber along with the copper sulfide to serve as a carrier gas. It will be appreciated that other gases or plasma substances can be injected into the chamber to facilitate depositing the copper sulfide onto the conductive layer.

A temperature system 818 also is provided for selectively regulating the temperature within the chamber 802. For example, the system 818 may be a diffusion type system (e.g., a horizontal or vertical furnace) operable to diffuse heat into the chamber 802. The temperature system 818 may implement its own temperature control process or such control may be implemented as part of other sensors 820 operatively associated with the etching chamber 802. By way of example, the plasma enhanced chemical vapor deposition of copper sulfide can be carried out at a relatively low temperature of between about 400 to 600 K. A pressure system 822 is also included in the system to selectively regulate the pressure within the chamber. The pressure system 822 may include, for example, one or more vent conduits 824 having valves 826 that may be controllably opened and/or closed to varying degrees to assist with selectively adapting the pressure within the chamber 802. The deposition of copper sulfide can similarly be performed at a relatively low pressure of between about 0.05 to 0.5 Pa.

The system 800 can also include a load system 828 operatively connected to the chamber 802 for loading and unloading wafers into and out of the etching chamber. The load system 828 typically is automated to load and unload the wafers into the chamber at a controlled rate. The system further may include a display 830 operatively coupled to a control system 832 for displaying a representation (e.g., graphical and/or textual) of one or more operating parameters (e.g., temperature within the chamber, pressure within the chamber, thickness of material deposited, chart of rate of material being deposited).

A power supply 834 is included to provide operating power to components of the system 800. Any suitable power supply (e.g., battery, line power) suitable for implementation with the present invention can be utilized. An excitation system 836 is operatively associated with the chamber 802. The system 836 includes a coil 840 and an RF excitation (e.g., voltage) source 842 wherein the coil 840 is excited by the RF excitation source 842 which in turn electrically excites one or more gases within the chamber to facilitate deposition of one or more gases, and in this case the copper sulfide, onto an underlying layer, such as the conductive layer. In particular, an rf plasma field generated by the excited coil and the metal oxide precursor activates the process of depositing the gaseous conductivity facilitating copper sulfide (optionally carried by gaseous helium) onto the conductive layer.

The system can also include a measurement system 844 for in-situ monitoring of processing within the chamber, such as, for example, thickness of film being deposited. The monitoring system 844 can be a standalone component and/or can also be distributed between two or more cooperating devices and/or processes. Similarly, the monitoring system 844 can reside in one physical or logical device (e.g., computer, process) and/or be distributed between two or more physical or logical devices. The measurement system 844 includes one or more non-destructive measurement components, such as may utilize optical interference, scatterometry, IR spectroscopy, ellipsometry, scanning electron microscopy, synchrotron and/or x-ray diffraction techniques. The measurement system includes a beam source 846 and detector 848. It is to be appreciated that while one beam source 846 and one beam detector 848 are shown in the example illustrated, more than one of these components may be included to measure film thickness and/or compositions, for example, at various locations on the wafer. The source portion 846 provides one or more beam(s) 850 (e.g., of light from a frequency stabilized laser, laser diode or helium neon (HeNe) gas laser) toward the surface of the conductive layer 808 on the wafer 806 whereon copper sulfide is deposited. The beam 820 interacts with the film and is altered thereby (e.g., reflected, refracted, and diffracted). The altered beam(s) 852 are received at the detector portion 848 of the measurement system 844 and have beam properties (e.g., magnitude, angle, phase, polarization), which can be examined relative to that of the incident beam(s) 850 to determine an indication of one or more properties of the film being deposited (e.g., thickness, chemical species). A plurality of incident beams from one or more sources directed at different spaced apart locations may be employed, for example, to yield corresponding measurements of film thickness at these locations substantially concurrently during the process. The concurrent measurements, in turn, may provide an indication of deposition uniformity and may be useful in controlling the process to efficiently and economically achieve desired results and mitigate the need for and/or degree of subsequent processing steps, such as, for example, selective re-deposition of copper sulfide and/or chemical mechanical polishing at particular locations on the wafer.

What have been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application.

What is claimed is:

1. A memory device comprising:
   an array of memory formations associated with lithographic features of a wafer surface, each memory formation comprising:
   a first electrode formed from a bit line of the wafer;
   two second electrodes in parallel orientation with respect to the first electrode on walls of adjacent lithographic features of the wafer surface, to form two memory bits for one lithographic feature; and
   a selectively conductive media placed between the first electrode and each one of the second electrodes, the first electrode operable with each of the second electrodes to selectively activate a memory portion of the selective conductive media.

2. The memory device of claim 1, each second electrode is substantially vertical and stacked laterally next to a side of the first electrode.

3. The memory device of claim 1, the selectively conductive media comprises at least one of a passive material and an organic material.

4. The memory device of claim 3, the organic material is a polymer.

5. The memory device of claim 3, the first electrode is operative with the second electrode as to activate a memory portion of the organic material.

6. The memory device of claim 1, the selectively conductive material is formed by a depositing system.

7. The memory device of claim 1, the first electrode formed according to a single or dual damascene process.

8. A method for fabricating a memory cell comprising:
   providing a wafer having a bit line electrode with a raised surface above a substrate layer;
   forming a selectively conductive layer over the raised surface and the substrate layer; forming a top electrode layer over the selectively conductive layer; and etching a surface to form an array of memory formations, each memory formation comprising: a first electrode formed from the bit line electrode of the wafer; two second electrodes in parallel orientation with respect to the first electrode on walls of adjacent lithographic features of the wafer surface, to form two memory elements for one lithographic feature, wherein the selectively conductive layer is placed between the first electrode and each one of the second electrodes, the first electrode operable with each of the second electrodes to selectively activate a memory portion of the selective conductive media.

9. The method according to claim 8, associating with two adjacent memory elements further comprises selectively activating a portion of the memory element.

10. The meted according to claim 8, etching a surface further comprises etching a surface of the top electrode layer or a surface of the selectively conductive layer.

11. The method according to claim 8, etching a surface further comprises etching a surface of the bit line electrode.

12. The method according to claim 8, further comprising; etching a surface of the selective conductive layer before forming the top electrode layer.

13. The method according to claim 8, etching a surface of the selective conductive layer farther comprises a CMP process.

14. The method according to claim 8, further comprising: forming a barrier layer to mitigate diffusion of the first electrode and the top electrode into a layer.

15. The method according to claim 8, further comprising: forming the selectively conductive layer by a chemical vapor deposition process.

16. The method according to claim 8 further comprising: forming at least one word line to access one or more of the memory cells fabricated in accordance with claim 8.

17. The method according to claim 8, further comprising forming a $Cu_2S$ layer.

18. The method according to claim 8 further comprising forming the selective conductive layer and the top electrode layer by gas phase reaction process.

19. The method according to claim 8 further comprising forming a partitioning component next to the top electrode layer.

20. A memory device comprising:
means for forming two memory elements on sidewalls of a lithographic feature, comprising:
means for forming first and second electrodes in a parallel direction with respect to a third electrode; and
means for sharing the third electrode between the two memory elements.

21. A memory arrangement comprising:
a first electrode operable with second and third electrodes positioned sideways and oriented parallel thereof, to form two memory elements for one lithographic feature on a wafer surface, each memory element comprising a selective conductive material that is sandwiched between the first electrode and one of the second and third electrodes.

22. The memory arrangement of claim 21, the second and third electrodes each comprising at least one of aluminum, chromium, copper, germanium, gold, magnesium, manganese, indium, iron, nickel, palladium, platinum, silver, titanium, zinc, alloys thereof, indium-tin oxide, polysilicon, doped amorphous silicon, and metal silicides.

* * * * *